(12) United States Patent
Balaram et al.

(10) Patent No.: US 8,954,838 B2
(45) Date of Patent: Feb. 10, 2015

(54) PRESENTING DATA IN A TABULAR FORMAT

(75) Inventors: Anil P. Balaram, Nepean (CA); Takashi Toyooka, Ottawa (CA)

(73) Assignee: Synopsys, Inc., Mountain View, CA (US)

(*) Notice: Subject to any disclaimer, the term of this patent is extended or adjusted under 35 U.S.C. 154(b) by 647 days.

(21) Appl. No.: 12/631,365

(22) Filed: Dec. 4, 2009

(65) Prior Publication Data

US 2011/0138265 A1    Jun. 9, 2011

(51) Int. Cl.
*G06F 17/24* (2006.01)
*G06F 17/00* (2006.01)
*G06F 17/50* (2006.01)

(52) U.S. Cl.
CPC .......... *G06F 17/5022* (2013.01); *G06F 17/246* (2013.01)
USPC ............ 715/217; 715/220; 715/225; 715/219

(58) Field of Classification Search
CPC ..................................................... G06F 17/246
USPC .................... 715/217, 219, 220, 225
See application file for complete search history.

(56) References Cited

U.S. PATENT DOCUMENTS

| | | | | |
|---|---|---|---|---|
| 5,680,557 A * | 10/1997 | Karamchetty | ............... | 715/866 |
| 6,377,285 B1 * | 4/2002 | Doan et al. | .................. | 715/764 |
| 6,411,313 B1 * | 6/2002 | Conlon et al. | ................. | 715/769 |
| 6,626,959 B1 * | 9/2003 | Moise et al. | .................. | 715/210 |
| 7,461,340 B1 * | 12/2008 | Mauceri et al. | ............... | 715/243 |
| 2001/0049699 A1 * | 12/2001 | Pratley et al. | .................. | 707/503 |
| 2002/0184261 A1 * | 12/2002 | Yamane | ......................... | 707/503 |
| 2004/0193520 A1 * | 9/2004 | LaComb et al. | ................. | 705/35 |
| 2004/0210822 A1 * | 10/2004 | Kotler et al. | ...................... | 715/500 |
| 2005/0015379 A1 * | 1/2005 | Aureglia et al. | .............. | 707/100 |
| 2006/0200779 A1 * | 9/2006 | Taylor | ............................ | 715/781 |
| 2008/0046536 A1 * | 2/2008 | Broda | ............................ | 709/217 |
| 2008/0189653 A1 * | 8/2008 | Taylor et al. | ................... | 715/792 |
| 2009/0254399 A1 * | 10/2009 | Cristol | .............................. | 705/8 |
| 2010/0042913 A1 * | 2/2010 | Chamberlain et al. | ......... | 715/215 |
| 2010/0281420 A1 * | 11/2010 | Taylor | ............................ | 715/781 |
| 2011/0118130 A1 * | 5/2011 | Loring et al. | ...................... | 506/7 |

(Continued)

OTHER PUBLICATIONS

Master Visually®: Excel® 2007 by Elaine Marmel, Publisher: Visual Mar. 10, 2008 (pp. 106, 107, 224, 225, 360, 365, 502, 503).*

(Continued)

*Primary Examiner* — William Bashore
*Assistant Examiner* — Nathan Shrewsbury
(74) *Attorney, Agent, or Firm* — Park, Vaughan, Fleming & Dowler LLP; Laxman Sahasrabuddhe

(57) ABSTRACT

Some embodiments provide a system for displaying cells of a table. During operation, the system can receive a sort-and-merge request for sorting the rows of the table using a sort column. Next, the system can sort the rows of the table based at least on cell values in the sort column to obtain a sorted table. The system can then merge a set of consecutive cells in a merge column of the sorted table to obtain a merged cell, wherein the set of consecutive cells are associated with the same cell value. Note that the sort column and the merge column can be the same column, or they can be different columns. Next, the system can display the merged cell and other cells in the sorted-and-merged table. Displaying a cell can involve positioning the cell's value in a visible area of the cell.

17 Claims, 6 Drawing Sheets

(56) References Cited

U.S. PATENT DOCUMENTS

2012/0060078 A1* 3/2012 Beauchamp et al. ......... 715/201
2013/0185349 A1* 7/2013 Broda ........................... 709/203

OTHER PUBLICATIONS

Merge Duplicate Cells Into One as posted at http://www.ozgrid.com/forum/showthread.php?t=74062 on Jul. 30, 2007.*

Stable Sort posted on http://web.archive.org/web/20080307081032/http://www.sgi.com/tech/stl/stable_sort.html as of Mar. 7, 2008.*
Power Distribution Network Design Tool available at http://web.archive.org/web/20080915053127/http://www.altera.com/technology/signal/power-distribution-network/sgl-pdn.html as of Sep. 15, 2008.*

* cited by examiner

TABLE 202

|   | PARAM. A | PARAM. B | PARAM. C | PARAM. D | RES. E | RES. F |
|---|---|---|---|---|---|---|
| R1 | 1 | 5.0 K | 0.33 | 1 | 1.1 | ~ |
| R2 | 1 | 5.0 K | 0.33 | 2 | 1.3 | ~ |
| R3 | 1 | 5.0 K | 0.67 | 1 | 3.6 | ~ |
| R4 | 1 | 5.0 K | 0.67 | 2 | 3.7 | ~ |
| R5 | 1 | 15.0 K | 0.33 | 1 | 7.4 | ~ |
| R6 | 1 | 15.0 K | 0.33 | 2 | 7.5 | ~ |
| R7 | 1 | 15.0 K | 0.67 | 1 | 9.2 | ~ |
| R8 | 1 | 15.0 K | 0.67 | 2 | 9.3 | ~ |
| R9 | 2 | 5.0 K | 0.33 | 1 | 1.2 | ~ |
| R10 | 2 | 5.0 K | 0.33 | 2 | 3.4 | ~ |
|   | C1 | C2 | C3 | C4 | C5 | C6 |

ROWS 204, COLUMNS 206

FIG. 2A

MERGED CELL 208

TABLE 202

|   | PARAM. A | PARAM. B | PARAM. C | PARAM. D | RES. E | RES. F |
|---|---|---|---|---|---|---|
| R1 | 1 | 5.0 K | 0.33 | 1 | 1.1 | ~ |
| R2 | 1 | 5.0 K | 0.33 | 2 | 1.3 | ~ |
| R3 | 1 | 5.0 K | 0.67 | 1 | 3.6 | ~ |
| R4 | 1 | 5.0 K | 0.67 | 2 | 3.7 | ~ |
| R5 | 1 | 15.0 K | 0.33 | 1 | 7.4 | ~ |
| R6 | 1 | 15.0 K | 0.33 | 2 | 7.5 | ~ |
| R7 | 1 | 15.0 K | 0.67 | 1 | 9.2 | ~ |
| R8 | 1 | 15.0 K | 0.67 | 2 | 9.3 | ~ |
| R9 | 2 | 5.0 K | 0.33 | 1 | 1.2 | ~ |
| R10 | 2 | 5.0 K | 0.33 | 2 | 3.4 | ~ |
|   | C1 | C2 | C3 | C4 | C5 | C6 |

FIG. 2B

TABLE 202

|  | PARAM. A | PARAM. B | PARAM. C | PARAM. D | RES. E | RES. F |
|---|---|---|---|---|---|---|
| R1 | 1 | 5.0 K | 0.33 | 1 | 1.1 | ~ |
| R2 |  |  |  | 2 | 1.3 | ~ |
| R3 |  | 15.0 K |  | 1 | 7.4 | ~ |
| R4 |  |  |  | 2 | 7.5 | ~ |
| R5 | 2 | 5.0 K |  | 1 | 1.2 | ~ |
| R6 |  |  |  | 2 | 3.4 | ~ |
| R7 |  | 15.0 K |  | 1 | 7.7 | ~ |
| R8 |  |  |  | 2 | 7.6 | ~ |
| R9 | 1 | 5.0 K | 0.67 | 1 | 3.6 | ~ |
| R10 |  |  |  | 2 | 3.7 | ~ |
|  | C1 | C2 | C3 | C4 | C5 | C6 |

FIG. 2C

SELECTED CELL 210

TABLE 202

|  | PARAM. A | PARAM. B | PARAM. C | PARAM. D | RES. E | RES. F |
|---|---|---|---|---|---|---|
| R1 | 1 | 5.0 K | 0.33 | 1 | 1.1 | ~ |
| R2 |  |  |  | 2 | 1.3 | ~ |
| R3 |  | 15.0 K |  | 1 | 7.4 | ~ |
| R4 |  |  |  | 2 | 7.5 | ~ |
| R5 | 2 | 5.0 K |  | 1 | 1.2 | ~ |
| R6 |  |  |  | 2 | 3.4 | ~ |
| R7 |  | 15.0 K |  | 1 | 7.7 | ~ |
| R8 |  |  |  | 2 | 7.6 | ~ |
| R9 | 1 | 5.0 K | 0.67 | 1 | 3.6 | ~ |
| R10 |  |  |  | 2 | 3.7 | ~ |
|  | C1 | C2 | C3 | C4 | C5 | C6 |

TABLE 202

| | PARAM. A | PARAM. B | PARAM. C | PARAM. D | RES. E | RES. F |
|---|---|---|---|---|---|---|
| R1 | 1 | 5.0 K | 0.33 | 1 | [1, 2) | ~ |
| R2 | 1 | 5.0 K | 0.33 | 2 | [1, 2) | ~ |
| R3 | 2 | 5.0 K | 0.33 | 1 | [1, 2) | ~ |
| R4 | 2 | 5.0 K | 0.33 | 2 | [1, 2) | ~ |
| R5 | 1 | 5.0 K | 0.67 | 1 | [3, 4) | ~ |
| R6 | 1 | 5.0 K | 0.67 | 2 | [3, 4) | ~ |
| R7 | 2 | 5.0 K | 0.67 | 1 | [3, 4) | ~ |
| R8 | 2 | 5.0 K | 0.67 | 2 | [3, 4) | ~ |
| R9 | 1 | 15.0 K | 0.33 | 1 | [7, 8) | ~ |
| R10 | 1 | 15.0 K | 0.33 | 2 | [7, 8) | ~ |
| | C1 | C2 | C3 | C4 | C5 | C6 |

PRESENTING DATA IN A TABULAR FORMAT

TECHNICAL FIELD

The present disclosure generally relates to graphical user interfaces. More specifically, the present disclosure relates to methods and apparatuses for presenting data in a tabular format.

BACKGROUND

Related Art

A software application's usefulness is often limited by the effectiveness of its user interface. For this reason, the industry is always looking for ways to improve user interfaces so that it can help increase user productivity. However, user interfaces have struggled to keep up with the exponential increase in data sizes.

Specifically, managing the massive volumes of data produced by the simulation of modern electronic circuits is a key problem in the creation of software tools used in electronic design automation (EDA). Designers increasingly also use those software tools to help them search the design space by generating more simulations that analyze how results change when components are added, removed, or changed, or when global parameters, like ambient temperature, are changed. These iterative simulations multiply the amount of simulation data that must be presented to and analyzed by the designer.

SUMMARY

Some embodiments of the present invention provide systems and techniques for displaying cells of a table which are arranged in rows and columns. The table can generally contain any data. Specifically, in some embodiments, the table contains circuit simulation data that was generated by simulating a circuit design under different conditions. For example, each row in the table may store parameter values and simulation results for a particular simulation run.

During operation, the system can receive a sort-and-merge request for sorting the rows of the table based on a sort column. Note that a sort column can be any column in the table whose cells contain values that are capable of being sorted. Next, the system can sort the rows of the table based at least on cell values in the sort column to obtain a sorted table. The system can then merge a set of consecutive cells that have the same value to obtain a merged cell. Note that the merging operation may be performed on merge columns, which can be one or more columns in the table whose cells are capable of being merged with one another, and whose cells contain values which can be compared with one another to determine if the cell values are the same. Further, note that the sort column and the merge column can be the same column, or they can be different columns. Next, the system can display the merged cell and optionally other cells in the sorted-and-merged table. Specifically, displaying a cell can involve positioning the cell's value in a visible area of the cell.

In some embodiments, sorting the rows of the table based at least on the cell values in the sort column can include performing a stable sort of the rows of the table based at least on the cell values in the sort column.

In some embodiments, the system can receive a plot request for plotting data associated with a merged cell. The system may select a set of cells in a plot column which are associated with the merged cell. A plot column can be any column whose cells are associated with plottable data. Next, the system can display one or more plots using the plottable data associated with the selected cells.

In some embodiments, the system may receive a set of bins, wherein each bin defines a range of cell values. The system can then associate a cell with a bin based on the cell's value. Next, during the merging operation, the system can merge cells based on the associated bins, instead of merging the cells based on the cell values.

BRIEF DESCRIPTION OF THE FIGURES

FIGS. 2A-2E illustrate how cells of a table can be displayed in accordance with some embodiments of the present invention.

FIG. 3 presents a flowchart that illustrates a process for displaying cells of a table in accordance with some embodiments of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
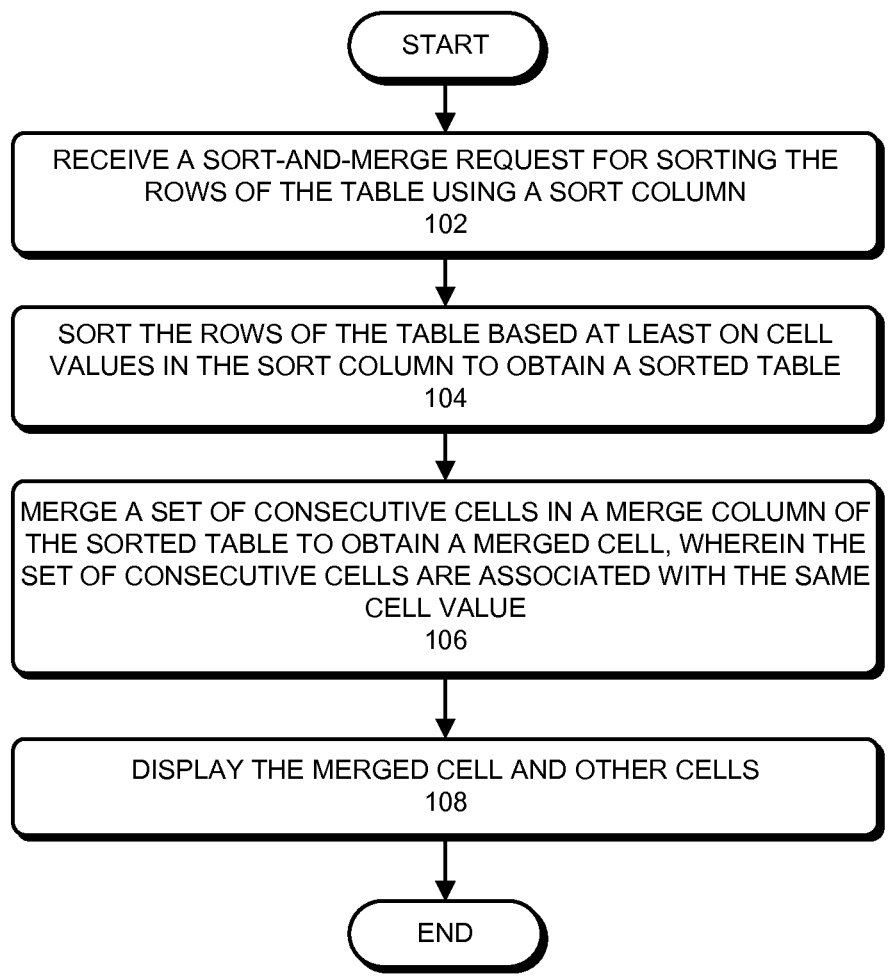
FIG. 1 presents a flowchart that illustrates a process for displaying cells of a table which are arranged in rows and columns in accordance with some embodiments of the present invention.

FIG. 1 presents a flowchart that illustrates a process for displaying cells of a table which are arranged in rows and columns in accordance with some embodiments of the present invention.

The process illustrated in FIG. 1 is generally applicable to any table. For example, multiple simulation runs can be performed for a circuit design with different parameter values to generate simulation results. Next, a table can be created to present the parameter values and the simulation results such that each row in the table includes parameter values and simulation results for a particular simulation run.

The process can begin by receiving a sort-and-merge request for sorting the rows of the table using a sort column (block 102). Note that a sort column can be any column in the table whose cells contain values that are capable of being sorted.

Note that the term "receive" (or any of its variants) as used in this disclosure generally refers to an operation that makes specific information available to the system. For example, a system may receive the sort-and-merge request when a user selects a column. Alternatively, the system may receive the sort-and-merge request when an application invokes a function that performs the sort-and-merge operation. Further, the system may receive data when the system is given a filename that contains the data.

Continuing with the discussion of FIG. 1, in response to receiving the sort-and-merge request, the system can sort the rows of the table based at least on cell values in the sort column to obtain a sorted table (block 104). In some embodiments, the system sorts the rows of the table by performing a stable sort of the rows of the table based at least on the cell values in the sort column. Note that sorting the rows by using a stable sort technique enables a user to provide secondary, tertiary, etc. keys for sorting in reverse chronological order. For example, suppose the user first sorts by column C1, then by column C4, and finally by column C2. If a stable sort technique is used, then C2 (the last column that was used for sorting) is the primary key, C4 is the secondary key, and C1 is the tertiary key.

The system can then merge a set of consecutive cells in a merge column of the sorted table to obtain a merged cell, wherein the set of consecutive cells are associated with the same cell value (block 106). Note that a merge column can be any column in the table whose cells are capable of being merged with one another, and whose cells contain values which can be compared with one another to determine if the cell values are the same. Further, note that the sort column and the merge column can be the same column, or they can be different columns. During the merge operation, the system can merge cells in multiple columns, i.e., the system can merge consecutive cells in one column, and then merge consecutive cells in another column, and so forth.

Next, the system can display the merged cell and other cells (block 108). Note that, in its internal representation, the table may maintain each cell in the set of consecutive cells as a separate cell. However, for purposes of displaying the cells, the table may display a merged cell as a single large cell that combines multiple cells. Further, in some embodiments, the system can display the merged cell (or any other cell) by positioning the merged cell's value in a visible area of the merged cell.

For the sake of clarity and ease of discourse, embodiments of the present invention are described in terms of performing one type of operation on a row and another type of operation on a column. However, it will be apparent to one skilled in the art that the role of rows and columns can be reversed, i.e., the operations that are performed on rows can be performed on columns, and the operations that are performed on columns can be performed on rows. Specifically, in some embodiments, the system can sort columns of the table based on cell values in a sort row, and merge equal valued consecutive cells in a merge row to obtain a merged cell.

FIGS. 2A-2E illustrate how cells of a table can be displayed in accordance with some embodiments of the present invention.

Table 202 shown in FIG. 2A includes cells which are arranged in rows 204 (labeled R1 through R10), and columns 206 (labeled C1 through C6). The row above row R1 contains the heading for each column, and is typically not used for performing computations on the table. Each row may similarly have a heading column, e.g., in a column that is to the left of column C1.

A column can generally be associated with an input or an output of a computation. For example, columns C1, C2, C3, and C4 may be associated with parameters A, B, C, and D, respectively, which may be associated with parameter values for a circuit simulation. Columns C5 and C6 may be associated with simulation results. For example, column C5 may be associated with the voltage of a net. Column C6 may contain a link to a file which contains plottable data, e.g., the file may contain the variation of voltage values over time.

FIG. 2B illustrates the result of performing a sort-and-merge operation based on column C1. (Note that column C1's header is shaded in FIG. 2B to indicate that C1 is the sort column.) Specifically, the system can sort the rows in the table based at least on the cell values in column C1. Note that the cells in FIG. 2A are already sorted according to the cell values in column C1, and hence, the row order shown in FIG. 2B is the same as the row order shown in FIG. 2A.

Once the rows have been sorted, the system can merge consecutive cells in a column that have the same value. The merge operation can be performed on one or more columns. Specifically, metadata associated with each column and/or cell may specify whether the cells are allowed to be merged.

For example, since the cells in column C1 that correspond to rows R1-R8 have the same value, they have been merged in FIG. 2B to create merged cell 208. Similarly, consecutive cells in other columns have been merged based on their cell values. Note that, although FIG. 2A and FIG. 2B display the same data, it is much easier for a user to understand and manage the data presented in FIG. 2B than it is to understand and manage the data presented in FIG. 2A.

FIG. 2C illustrates the layout of the table after performing a sort-and-merge operation based on column C3. (Note that column C3's header is shaded in FIG. 2C to indicate that C3 is the sort column.) In some embodiments, the system can use a stable sorting operation to sort the rows. A stable sort maintains the relative positions of the records that are being sorted if the key values for the records are the same. For example, rows R3 and R4 in FIG. 2B have the same value in column C3. When a stable sorting process is used, their positions relative to one another are maintained. For example, rows R3 and R4 in FIG. 2B have moved to rows R9 and R10, respectively, in FIG. 2C. If a stable sort had not been used, rows R3 and R4 in FIG. 2B could have moved to rows R10 and R9, respectively, in FIG. 2C.

FIG. 2D illustrates how selecting a cell can cause plottable data associated with the selected cell to be plotted. After the table has been sorted and cells have been merged, a user can select a cell and generate plots based on plottable data that is associated with the selected cell. As shown in FIG. 2D, the system can receive a plot request for plotting data associated with selected cell 210.

Note that one or more columns in the table may include plottable data. For example, column C6 is a plot column, i.e., at least some cells in column C6 include plottable data (the waveform symbol in the cells of column C6 indicates that the cells contain plottable data). The user may specify which columns to use to generate the plots, or the system may select all columns that include plottable data for generating the plots. For a given plot column, the system can select a set of cells in the plot column which are in the same set of rows as the selected cell. For example, in FIG. 2D, the system can select plot cells 212 in plot column C6 which correspond to the rows of selected cell 210.

Next, the system can use the plottable data in the plot cells to display one or more plots. For example, each cell in column C6 may contain the variation of voltage values over time for different simulation runs. Hence, in response to receiving the plot request, the system can use the plottable data associated with cells 212 to plot multiple curves that correspond to the voltage variations for different simulation runs.

Some columns may include values that are not suitable for performing a sort-and-merge operation. For example, in FIG. 2A, each cell in column C5 has a unique floating point value. Hence, column C5 is not suitable for performing a sort-andmerge operation because no merging is expected to occur. However, if the floating point values are binned, the sort-and-merge operation may cause certain cells to merge in column C5.

Specifically, the system can receive a set of bins for binning cell values in the sort column and/or the merge column. In some embodiments, the system can determine the total range of the values in a column. Next, the system can divide the total range of the values by a user-specified number of bins to obtain a set of bins. Once a set of bins is determined, the system can then associate each cell in the sort column and/or the merge column with a bin based at least on the cell's value. Next, for purposes of sorting and/or merging, the system can use the associated bin values instead of the actual cell values.

For example, the floating point values in column C5 can be binned into the following bins: bin "[1, 2)" which is associated with floating point values in the interval [1, 2); bin "[3, 4)" which is associated with floating point values in the interval [3, 4); and bin "[7, 8)" which is associated with floating point values in the interval [7, 8). Next, the rows can be sorted based on the bin values, and consecutive cells which have the same value can be merged. The resulting sorted-and-merged table is shown in FIG. 2E.

Note that when cells are merged in different columns, the boundaries of the merged cells may not line up. For example, in FIG. 2E, the boundary between the merged cells associated with bins [1, 2) and [3, 4) does not line up with the boundary between merged cells associated with parameter values 0.33 and 0.67.

Conventional approaches for displaying a cell's value display the cell's value at the same location in the cell regardless of how much of the cell is visible to the user. Unfortunately, if the location in the cell where the cell's value is displayed is not visible to a user, the user will see a blank cell. This problem is further exacerbated in merged cells because a merged cell spans multiple individual cells, and hence, the probability that the cell's value may be displayed in a location that is not visible to a user is higher.

Figures 2E, 3:
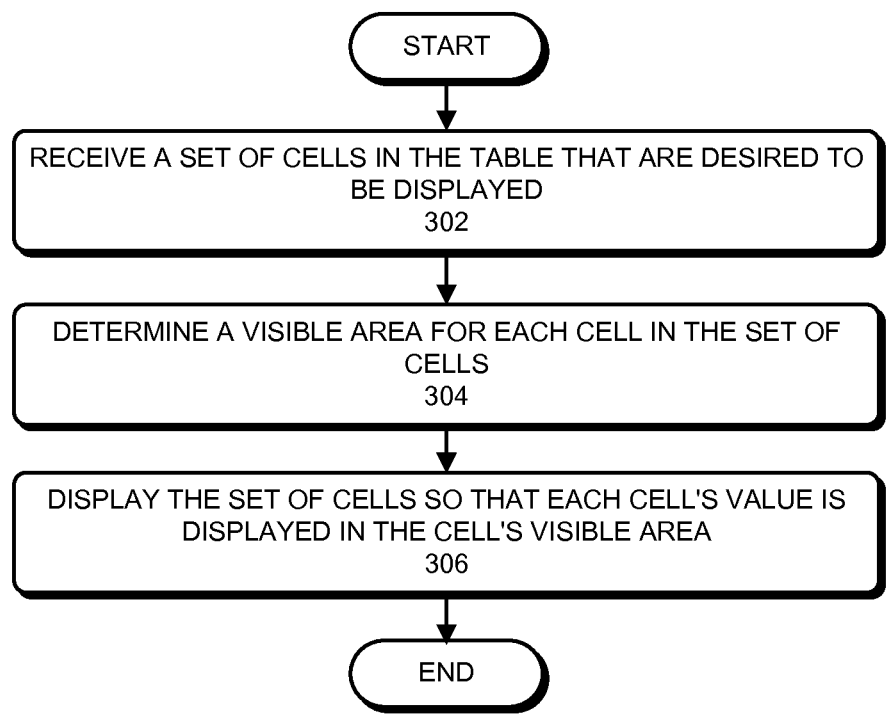

FIG. 3 presents a flowchart that illustrates a process for displaying cells of a table in accordance with some embodiments of the present invention.

The process can begin by receiving a set of cells in the table that are desired to be displayed (block 302). Next, the system can determine a visible area for each cell in the set of cells (block 304). The system can then display the set of cells so that each cell's value is displayed in the cell's visible area (block 306).

Figure 4:
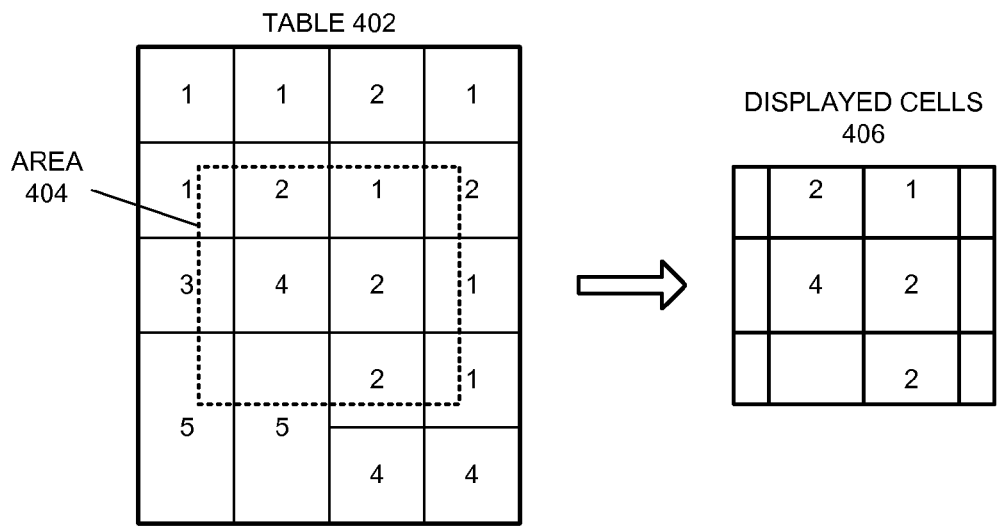
FIG. 4 illustrates a scenario in which a user may see blank cells.

FIG. 4 illustrates a scenario in which a user may see blank cells. Table 402 includes a plurality of cells whose values are shown in FIG. 4. If the table includes a large number of cells, it may not be practical to display the whole table. In such situations, the system may display only certain cells or a certain area of the table. The set of cells or the area in the table that is desired to be displayed can be selected by a user. For example, a user may want to display area 404 of table 402. Displayed cells 406 illustrate how a conventional technique would display area 404 of table 402 to a user. Note that some of the cells in displayed cells 406 are blank because the cell's value is positioned in an area of the cell that is not visible.

Figure 5:
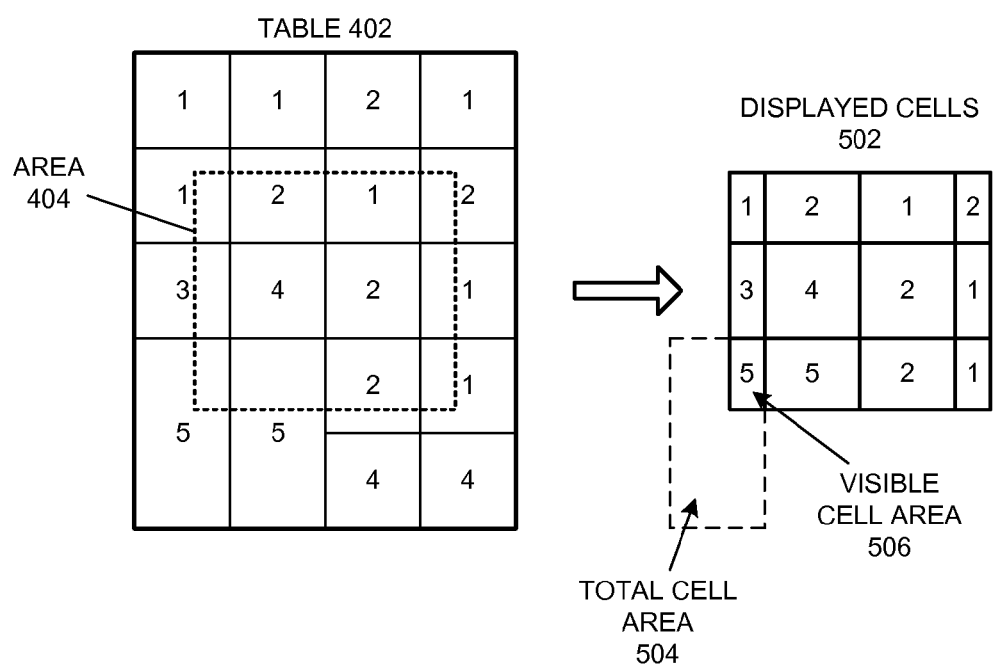
FIG. 5 illustrates how a cell's value can be displayed in a visible area in accordance with some embodiments of the present invention.

FIG. 5 illustrates how a cell's value can be displayed in a visible area in accordance with some embodiments of the present invention.

As shown in displayed cells 502, the system displays a cell's value in the visible area of the cell. For example, the bottom left corner cell in displayed cells 502 has a value of "5." Note that the visible cell area 506 of the bottom left corner cell is a small portion of the total cell area 504. Some embodiments of the present invention display the cell value "5" in the visible cell area 506.

If a user has specified that a particular alignment or justification (e.g., left justified, centered, right justified, etc.) should be used for displaying the cell's value, the same alignment or justification can be used for displaying the cell's value in the visible area. Note that the information conveyed by displayed cells 502 is much more useful to a user than the information conveyed by displayed cells 406.

Figure 6:
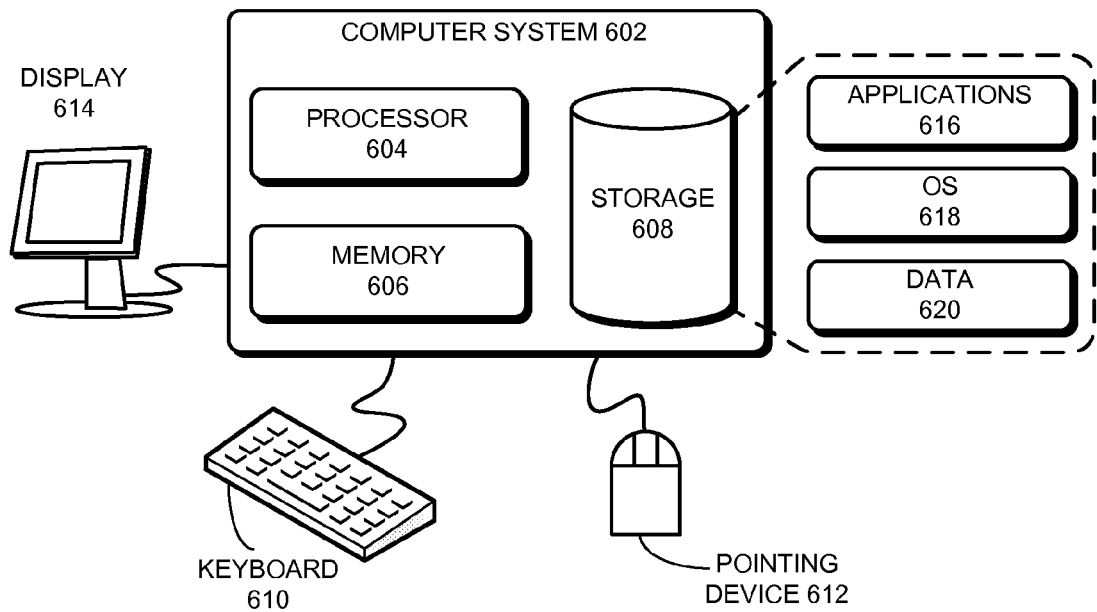
FIG. 6 illustrates a computer system in accordance with some embodiments of the present invention.

FIG. 6 illustrates a computer system in accordance with some embodiments of the present invention.

A computer or computer system can generally be any system that can perform computations. Specifically, a computer can be a microprocessor based system which may include multiple processing cores, a network processor based system, a digital signal processor based system, a portable computing device, a personal organizer, a distributed computing platform based system, or any other computing system now known or later developed.

Computer system 602 comprises processor 604, memory 606, and storage 608. Computer system 602 can be coupled with display 614, keyboard 610, and pointing device 612. Storage 608 can generally be any device that can store data. Specifically, a storage device can be a magnetic, an optical, or a magneto-optical storage device, or it can be based on flash memory and/or battery-backed up memory. Storage 608 can store application 616, operating system 618, and data 620.

Application 616 can include instructions that when executed by computer 602 cause computer 602 to perform one or more processes described in this disclosure. Data 620 can include cell values, table layout information, plottable data, and/or any other data that is inputted or outputted by one or more processes described in this disclosure.

Figure 7:
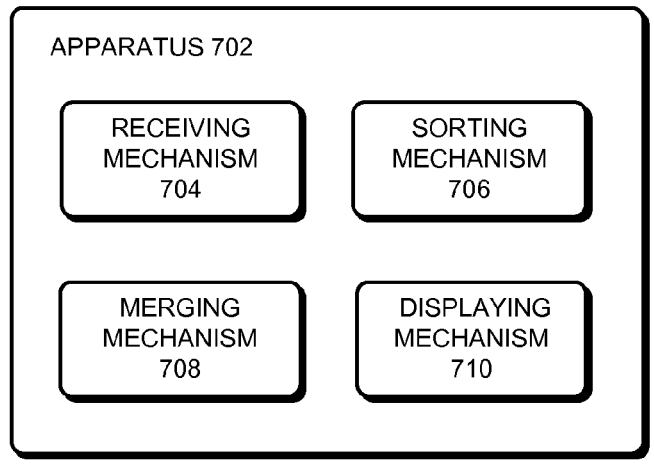
FIG. 7 illustrates an apparatus in accordance with some embodiments of the present invention.

FIG. 7 illustrates an apparatus in accordance with some embodiments of the present invention.

Apparatus 702 can comprise a number of mechanisms which may communicate with one another via a wired or wireless communication channel. Apparatus 702 may be realized using one or more integrated circuits. Apparatus 702 may be integrated with a computer system, or it may be realized as a separate device which is capable of communicating with other computer systems and/or devices. Specifically, apparatus 702 can comprise receiving mechanism 704, sorting mechanism 706, merging mechanism 708, and displaying mechanism 710. In some embodiments, sorting mechanism 706 and merging mechanism 708 can be combined into a sorting-and-merging mechanism.

In some embodiments, receiving mechanism 704 can be configured to receive a sort-and-merge request for sorting the rows of the table using a sort column. Sorting mechanism 706 can be configured to sort the rows of the table based at least on cell values in the sort column to obtain a sorted table. Merging mechanism 708 can be configured to merge a set of consecutive cells in a merge column of the sorted table to obtain a merged cell, wherein the set of consecutive cells are associated with the same cell value. Displaying mechanism 710 can be configured to display the merged cell. Specifically, displaying mechanism 710 can be configured to position the merged cell's value in a visible area of the merged cell.

In some embodiments, receiving mechanism 704 can be configured to receive a set of cells in the table that are desired to be displayed. Displaying mechanism 710 can be configured to determine a visible area for each cell in the set of cells and display the set of cells so that each cell's value is displayed in the cell's visible area.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a storage medium, a storage device, a hardware module, and/or a hardware apparatus. A computer-readable storage medium or device includes, but is not limited to, volatile memory, non-volatile memory, magnetic and optical storage devices such as disk drives, magnetic tape, CDs (compact discs), DVDs (digital versatile discs or digital video discs), or other devices, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-executed method for displaying cells of a table which are arranged in rows and columns, the method comprising:
   in response to receiving, at a computer, a single sort-and-merge request for sorting the rows of the table using a sort column and obtaining merged cells within columns based on cell values,
      the computer sorting the rows of the table based at least on cell values in the sort column to obtain a sorted table, and
      the computer merging a set of consecutive cells in a merge column of the sorted table to obtain a merged cell, wherein the set of consecutive cells are associated with the same cell value, and wherein the merged cell's value is displayed using a font size;
   receiving a selection of an area in the table that includes only a portion of the merged cell, wherein the portion of the merged cell is less than the entire merged cell; and
   displaying the merged cell's value in the portion of the merged cell using the font size.

2. The method of claim 1, wherein the sort column is the same as a merge column.

3. The method of claim 1, wherein the sort column is different from a merge column.

4. The method of claim 1, wherein sorting the rows of the table based at least on the cell values in the sort column includes performing a stable sort of the rows of the table based at least on the cell values in the sort column.

5. The method of claim 1, further comprising:
   in response to receiving, at the computer, a plot request for plotting data associated with the merged cell, wherein at least some cells in a plot column are associated with plottable data, the computer selecting a set of plot cells in the plot column which are in the same set of rows as the set of consecutive cells in the merge column; and
   displaying one or more plots using the plottable data associated with the set of plot cells.

6. The method of claim 1, further comprising:
   receiving a set of bins for binning cell values in a merge column; and
   associating each cell in the merge column with a bin based at least on the cell's value;
   wherein merging the set of consecutive cells in the merge column includes treating the bins associated with the set of consecutive cells as the cell values of the set of consecutive cells.

7. The method of claim 1, further comprising:
   performing multiple simulation runs for a circuit design with different parameter values to generate simulation results; and
   creating the table using the parameter values and the simulation results so that each row in the table includes parameter values and simulation results for a particular simulation run.

8. A non-transitory computer-readable storage device storing instructions that when executed by a computer cause the computer to perform a method for displaying cells of a table which are arranged in rows and columns, the method comprising:
   displaying cell values in a merge column;
   receiving a set of bins for binning cell values in the merge column, wherein each bin corresponds to a range of values;
   associating each cell in the merge column with a bin based at least on the cell's value;
   in response to receiving a single sort-and-merge request for sorting the rows of the table using a sort column and obtaining merged cells within columns based on cell values,
      sorting the rows of the table based at least on cell values in the sort column to obtain a sorted table, and
      merging a set of consecutive cells in the merge column of the sorted table to obtain a merged cell, wherein the set of consecutive cells are associated with the same bin;
   displaying a range of values in the merged cell that corresponds to the bin associated with the set of consecutive cells, wherein the range of values is displayed using a font size;
   receiving a selection of an area in the table that includes only a portion of the merged cell, wherein the portion of the merged cell is less than the entire merged cell; and
   displaying the range of values in the portion of the merged cell using the font size.

9. The computer-readable storage device of claim 8, wherein the sort column is the same as a merge column.

10. The computer-readable storage device of claim 8, wherein the sort column is different from a merge column.

11. The computer-readable storage device of claim 8, wherein sorting the rows of the table based at least on the cell values in the sort column includes performing a stable sort of the rows of the table based at least on the cell values in the sort column.

12. The computer-readable storage device of claim 8, wherein displaying the merged cell includes positioning the merged cell's value in a visible area of the merged cell.

13. The computer-readable storage device of claim 8, further comprising:
   in response to receiving, at the computer, a plot request for plotting data associated with the merged cell, wherein at least some cells in a plot column are associated with plottable data, the computer selecting a set of plot cells in the plot column which are in the same set of rows as the set of consecutive cells in the merge column; and
   displaying one or more plots using the plottable data associated with the set of plot cells.

14. The computer-readable storage device of claim 8, further comprising:
   performing multiple simulation runs for a circuit design with different parameter values to generate simulation results; and
   creating the table using the parameter values and the simulation results so that each row in the table includes parameter values and simulation results for a particular simulation run.

15. An apparatus for displaying cells of a table which are arranged in rows and columns, the apparatus comprising:
   a processor;
   a memory;
   a receiving mechanism configured to receive a single sort-and-merge request for sorting the rows of the table using a sort column and obtaining merged cells within columns based on cell values;
   a sorting-and-merging mechanism configured to:
      sort the rows of the table based at least on cell values in the sort column to obtain a sorted table, and
      merge a set of consecutive cells in a merge column of the sorted table to obtain a merged cell, wherein the set of consecutive cells are associated with the same cell value, and wherein the merged cell's value is displayed using a font size;
   receiving a selection of an area in the table that includes only a portion of the merged cell, wherein the portion of the merged cell is less than the entire merged cell; and
   a displaying mechanism configured to display the merged cell's value in the portion of the merged cell using the font size.

16. The apparatus of claim 15, wherein the sort column is the same as a merge column.

17. The apparatus of claim 15, wherein the sort column is different from a merge column.

* * * * *